Sept. 3, 1968 J. C. FORNARI 3,399,651

SUSCEPTOR FOR GROWING POLYCRYSTALLINE SILICON ON WAFERS OF MONOCRYSTALLINE SILICON

Filed May 26, 1967

INVENTOR.
JOSEPH C. FORNARI
BY
Frank D Prager
ATTORNEY

United States Patent Office 3,399,651

Patented Sept. 3, 1968

3,399,651

SUSCEPTOR FOR GROWING POLYCRYSTALLINE SILICON ON WAFERS OF MONOCRYSTALLINE SILICON

Joseph C. Fornari, Lansdale, Pa., assignor to Philco-Ford Corporation, Philadelphia, Pa., a corporation of Delaware Filed May 26, 1967, Ser. No. 641,645
8 Claims. (Cl. 118—500)

ABSTRACT OF THE DISCLOSURE

A silicized carbon susceptor for the high temperature vapor plating of a relatively thick layer of polycrystalline silicon on oxidized surfaces of single crystal silicon wafers. The susceptor provides shallow retaining wells to receive the wafers, the bottoms of the wells being contoured so that the edges of the wafers do not contact the well bottom.

BACKGROUND OF THE INVENTION

Field of the invention

Fabrication of silicon wafers for microcircuits, particularly of the oxide isolated type. The invention provides apparatus for use in that phase of the fabrication during which a relatively thick layer of polycrystalline silicon is grown on a single crystal wafer.

Description of the prior art

Various processes are known wherein single crystal silicon wafers are provided with layers of epitaxial silicon. These layers are very thin. They are formed by a vapor deposition process, during which the wafers simply rest on a flat surface, and usually on the flat, silicized surface of a carbon susceptor. Although this known process has sometimes tended to cement or "weld" the wafer to the susceptor, no serious difficulty was encountered so long as the deposited epitaxial material was very thin, for instance up to the order of a few microns. The wafers then merely popped free of the flat susceptor surface during a cooling phase of the process, due to differential thermal expansion and contraction of the different materials.

In recently developed oxide isolation processes, by contrast, wafers are provided with relatively thick layers, particularly of polycrystalline material. This has caused the difficulty that the wafers become solidly "welded" to a plane surface supporting them. They are then caused to fracture due to differential shrinkage of the wafer and its support, during the ensuing cooling process.

SUMMARY OF THE INVENTION

The invention overcomes this difficulty by providing the wafer support member, or susceptor, with wafer-retaining wells of special shape, characterized by the use of contoured bottoms. Preferably the bottom of each well is shaped as an upwardly convex segment of a sphere, the raised central area of which supports the wafer. The edge of a wafer supported in this way does not contact the well or its bottom. This prevents the welding action previously experienced, even when a relatively thick polycrystalline silicon layer is deposited. At the same time very adequate heat transfer is maintained, and undesirable displacement of wafers is prevented.

Figure 3:
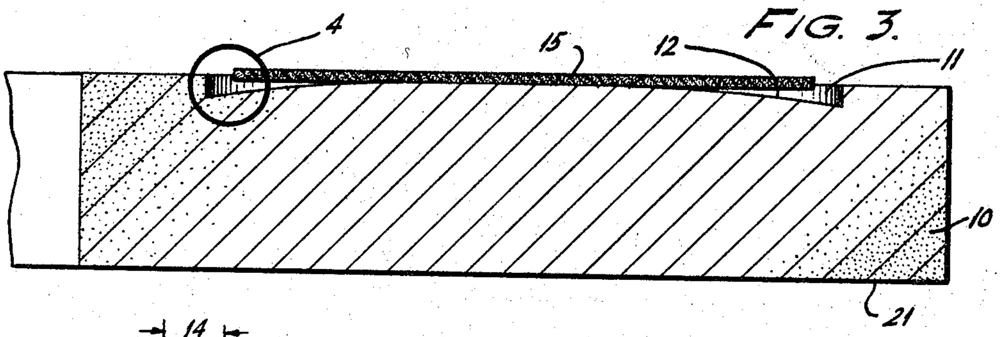
FIGURE 3 is a further enlargement of FIGURE 2, and also shows a wafer, supported in the illustrated well of the susceptor.

No attempt is made in any of the figures to represent actual dimensions, although the proportions of the preferred susceptor are shown in a relative sense, especially in FIGURE 3.

DESCRIPTION OF THE PREFERRED EMBODIMENT

Figure 1:
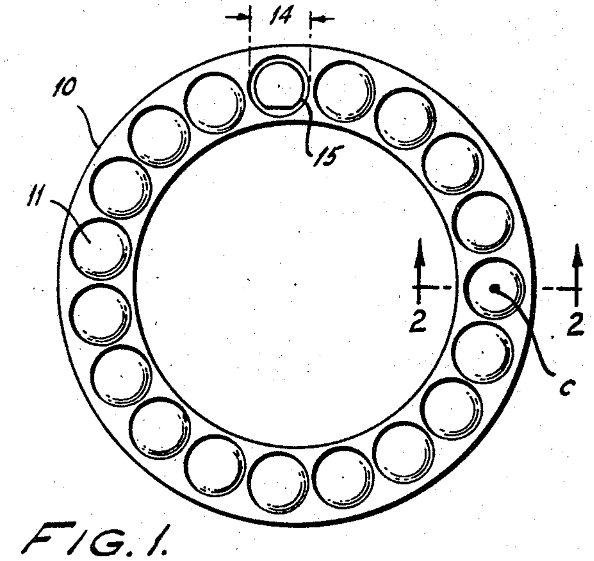
FIGURE 1 is a plan view of the new susceptor, showing the same on a somewhat reduced scale.
Figure 2:
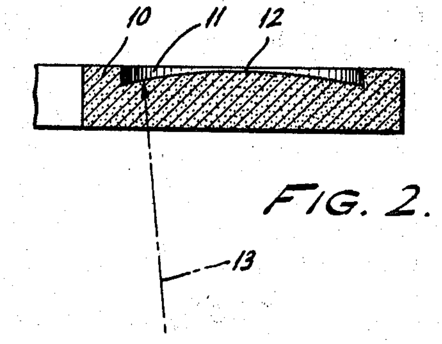
FIGURE 2 is an elevational sectional view taken along lines 2—2 in FIGURE 1 and drawn on a larger scale.

As indicated by FIGURES 1 and 2, the new susceptor 10 in its preferred form consists of a flat ring of carbon, although certain heat-conductive ceramic materials can be used. The ring has shallow circular retaining wells 11 in a flat top surface thereof, and these wells have specially contoured bottom surfaces 12. It is preferred to form each well bottom 12 as a flat mound integral with the susceptor and substantially coaxial and coextensive with the well. Particularly I prefer to form it as a segment of a sphere which has its center disposed vertically beneath the center C of the circular well. Radius 13 of the sphere desirably is about ten times as long as the horizontal diameter 14 of well 11.

Figure 4:
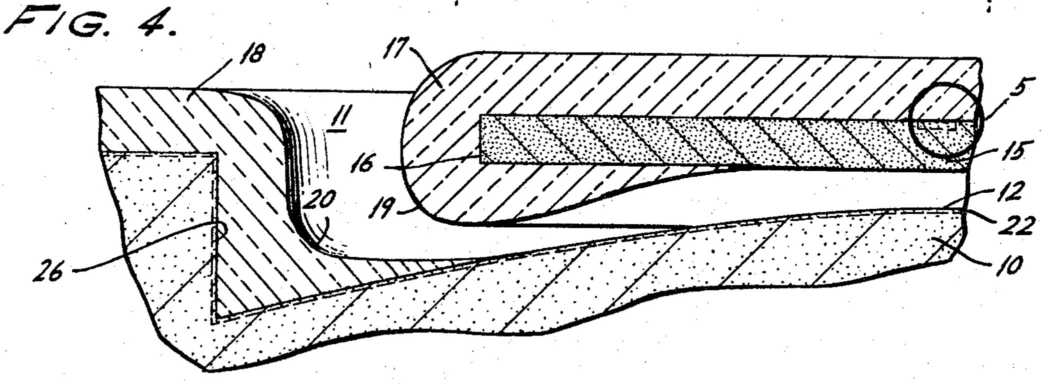
FIGURE 4 is an additionally enlarged, elevational, sectional view, showing the detail identified by number 4 in FIGURE 3.

In use, as best shown in FIGURE 3, each contoured well bottom 12 has a silicon wafer 15 supported thereon. The wafer diameter nearly equals the diameter of the well. As shown in FIGURE 4, this arrangement keeps the edge 16 of the wafer free of well bottom 12. The edge remains free of the well bottom even when thick polycrystalline coatings 17, 18 have been deposited on the wafer and susceptor, respectively. The coatings usually include large edge portions 19 on the wafer, and space-restricting, annular corner portions 20 on the well bottoms. As will be clear from the figure, progressive deposition causes these annular portions of deposits to come progressively closer to one another. Nevertheless, as also indicated, they do not coalesce or become "welded" together, on the bottom of the well, not even when very thick layers are deposited. The welding together is avoided by the free-edge arrangement of the wafer, which in turn is secured by bottom mound 12.

Figure 5:
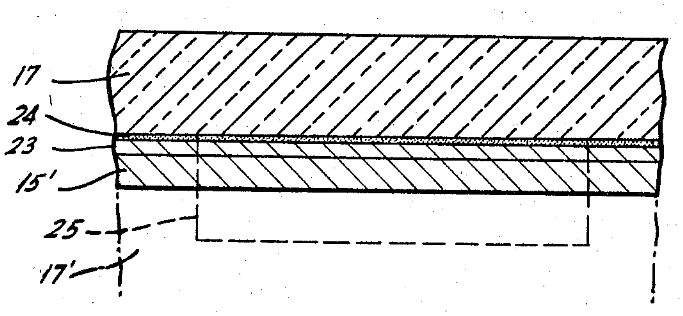
FIGURE 5 is a still more enlarged but otherwise similar view of the smaller detail, identified by number 5 in FIGURE 4.

Wafer 15 is preferably made in forms described in copending patent application Ser. No. 404,804, filed Oct. 19, 1964 by George L. Schnable, said application being assigned to the present assignee. Some of said forms are shown in FIGURES 1 and 2 of said copending application, and the present FIGURE 5 is, in substance, a combination of those figures. As noted in greater detail in the Schnable application, before wafer 15 is deposited in well 11, the surface thereof is provided with an epitaxially grown monocrystalline silicon (Si) layer 23, of distinctive resistivity, so that for instance the body of the wafer may be a single crystal of N+ type, and layer 23 then is, for instance of N type. In turn, the surface of this layer has been thermally oxidized to form thereover a layer 24 of silicon dioxide ($SiO_2$), which protects the monocrystalline surface and during later phases of the process forms a mask.

In actual use, and in accordance with known practice, the susceptor ring rests with its flat bottom surface 21 (FIGURE 3) on the top surface of an electric coil structure, not shown. The upper surface of the carbon susceptor ring, and of each well and well bottom therein, has a silicon carbide (SiC) layer 22, of up to about one micron thickness, formed thereon to provide a physically stable surface that will not evaporate away during the growing of polycrystalline silicon.

Only one wafer 15 is shown in FIGURE 1, in order to show the new well structure as clearly as possible. However, normally wafers 15 of the above-mentioned type, with expitiaxially grown and oxide-isolating films thereon, are inserted in all wells 11, in the use of the new, silicized carbon susceptor. Alternating current at radio frequency is sent through the susceptor-supporting coil structure, not shown, inducing electromagnetic fields, which in turn induce electric currents in the susceptor ring and thereby heat all portions of the ring substantially uniformly. The heat generated in the susceptor reaches the wafers thereon, as effective thermal coupling between susceptor and wafers is provided by the physical contact and close proximity between each contoured well surface, FIGURE 3, and the directly overlying wafer. Rapid deposition of polycrystalline silicon on the heated wafers is effected, for instance by hydrogen reduction of silicon tetrachloride ($SiCl_4$) at 1100° C. Because the silicon oxide layer surrounding the wafer is not monocrystalline, the further silicon layer deposited thereon by the hydrogen reduction of silicon tetrachloride will be polycrystalline.

The process is continued until a thick layer of the polycrystalline silicon has been applied. Typically, a wafer 15 of some 125 to 140 micron thickness has a polycrystalline layer 17 of about 175 microns thickness deposited thereon. Thereafter the original wafer 15 is lapped to reduce it in thickness, for example until it has a thickness of about 27 microns, in which connection see the layer shown at 15'. Resulting structure 17, 24, 23, 15' is shown in FIGURE 5.

The nature as well as the further transformation of this strutcure is fully described in the copending application, and is not part of the present invention. However, it should be noted that at a later stage of the process, another polycrystalline silicon layer 17' may be formed on the underside of lapped-down monocrystalline layer 15'. The first polycrystalline layer 17 is then removed, and individual microcircuit units 25 are formed. The susceptor provided by the present invention can be used with advantage in forming the first polycrystalline layer 17, fully illustrated herein, and also in forming the aforementioned second polycrystalline layer 17'. At both times the delicate and valuable wafers are successfuly coated, without dangers arising from the required heat cycles, by virtue of the new free-edge arrangement of the wafer on the susceptor.

Successful use of my new susceptor does not necessitate attempts to keep wafers 15 accurately centered in wells 11, or accurately normal to the vertical center line of the wells. In fact it would be difficult to maintain perfect positioning in such respects, during the heat applying and vapor depositing process, since the wafers often tend to slide on their support. Vertical walls 26 of wells 11, FIGURE 4, prevent the wafers from sliding out of the wells at any time of their treatment, and the wells have this restraining effect regardless of the deposition of silicon layers 19, 20. Should the edge 16 of the wafer contact such a wall, either before or during or after deposition of these layers, such contact occurs only in the region of contact, that is, over a limited peripheral portion of the wafer. Upon the subsequent cooling of the carbon susceptor and silicon wafer, when the differential contraction of these materials occurs, the wafer becomes free of any previous welding to the wall, by lateral popping-off. Even in the presence of a thick deposit, this limited, lateral movement does not generally lead to fracture of the wafer, in contrast to the condition encountered in former operations where all or most of the periphery of a wafer was welded to the susceptor surface, and where in most cases the wafers were broken during the cooling process.

While only a single embodiment of the invention has been described, the details thereof are not to be construed as limitative of the invention. For instance it is possible to provide susceptor 10 with a quartz surface layer or insert of substantial thickness, instead of the one-micron silicized film 22. The invention contemplates this and other variations and modifications, which come within the scope of the appended claims.

I claim:

1. A susceptor for plating a thick layer of crystalline material on surfaces of a thin wafer or the like, said susceptor comprising a body of refractory heat conductive material; at least one shallow well in a top surface of said body; and a mound in the well, rising in inward direction and with slight upward slope from outer bottom portions of the well.

2. A susceptor as decribed in claim 1 wherein said body is a ring of said material having a series of shallow wells distributed along its circumference, each well having one of said mounds.

3. A susceptor as described in claim 2 wherein each mound is integral with said body.

4. A susceptor as described in claim 1 wherein the mound is a segment of a sphere which has a center which is vertically below the center of the bottom.

5. A susceptor as described in claim 4 wherein the sphere has a radius several times larger than the diameter of the well.

6. A susceptor as described in claim 5 wherein the sphere has a radius about ten times larger than said diameter.

7. A susceptor as described in claim 1 wherein the refractory body is a ring provided with a plurality of wells.

8. A susceptor as described in claim 1 wherein said body substantially consists of silicized carbon.

References Cited

UNITED STATES PATENTS

| | | | |
|---|---|---|---|
| 3,099,579 | 7/1963 | Spitzer, et al. | 118—48 |
| 3,131,098 | 4/1964 | Krsek, et al. | 118—48 X |
| 3,233,578 | 2/1966 | Capita | 118—49.1 |
| 3,304,908 | 2/1967 | Gutsche, et al. | 118—49.5 |

OTHER REFERENCES

"Research On The Pyrolytic Deposition Of Thin Films," Wade Technical Report 59–363, Armour Research Foundation of Illinois Inst. of Technology—October 1959, pp. 5–6.

MORRIS KAPLAN, *Primary Examiner.*